United States Patent
Pingle et al.

(10) Patent No.: US 12,538,855 B2
(45) Date of Patent: Jan. 27, 2026

(54) INTEGRATED PROCESS SEQUENCE FOR HYBRID BONDING APPLICATIONS

(71) Applicant: Applied Materials, Inc., Santa Clara, CA (US)

(72) Inventors: Niranjan Pingle, Milpitas, CA (US); Jitendra Ratilal Bhimjiyani, Santa Clara, CA (US); Shreshtha Kumar Jaiswal, Kalispell, MT (US)

(73) Assignee: Applied Materials Inc., Santa Clara, CA (US)

( * ) Notice: Subject to any disclaimer, the term of this patent is extended or adjusted under 35 U.S.C. 154(b) by 531 days.

(21) Appl. No.: 18/078,416

(22) Filed: Dec. 9, 2022

(65) Prior Publication Data

US 2024/0194635 A1    Jun. 13, 2024

(51) Int. Cl.
*H01L 21/30*    (2006.01)
*H01L 21/46*    (2006.01)
*H01L 23/00*    (2006.01)

(52) U.S. Cl.
CPC ............ *H01L 24/80* (2013.01); *H01L 24/08* (2013.01); *H01L 2224/08245* (2013.01); *H01L 2224/80895* (2013.01); *H01L 2224/80896* (2013.01); *H01L 2224/80908* (2013.01); *H01L 2224/80986* (2013.01); *H01L 2924/37001* (2013.01); *H01L 2924/3701* (2013.01)

(58) Field of Classification Search
CPC .............. H01L 24/80; H01L 24/08; H01L 2224/08245; H01L 2224/80895; H01L 2224/80896; H01L 2224/80908; H01L 2224/80986; H01L 2924/37001; H01L 2924/3701; H01L 24/75
See application file for complete search history.

(56) References Cited

U.S. PATENT DOCUMENTS

| | | |
|---|---|---|
| 8,809,123 B2 | 8/2014 | Liu et al. |
| 10,354,972 B2 | 7/2019 | Liu et al. |
| 11,545,443 B2 | 1/2023 | Wu et al. |
| 2001/0051394 A1 | 12/2001 | Kim et al. |
| 2014/0011324 A1 | 1/2014 | Liu et al. |
| 2019/0252364 A1* | 8/2019 | Uzoh ............ H01L 24/75 |

FOREIGN PATENT DOCUMENTS

| | | |
|---|---|---|
| CN | 113688593 A | 12/2001 |
| WO | WO 2011-163441 A2 | 12/2011 |

OTHER PUBLICATIONS

International Search Report for PCT/US2023/082065, dated Apr. 4, 2024.

* cited by examiner

*Primary Examiner* — Niki H Nguyen
(74) *Attorney, Agent, or Firm* — Moser Taboada

(57) ABSTRACT

A method for sequencing a hybrid bonding process by double linking a source of dies and a target. The method may include selecting a source of dies for bonding, selecting a target on which the dies will be bonded, linking the source to the target, linking the target to the source, forming an integrated bonding product sequence that includes a first linked bonding sequence for the source and a second linked bonding sequence for the target, determining bonding process chamber allocations and process timing for the source and the target based on the integrated bonding product sequence, and bonding a die from the source to the target using the integrated bonding product sequence.

20 Claims, 5 Drawing Sheets

INTEGRATED PROCESS SEQUENCE FOR HYBRID BONDING APPLICATIONS

FIELD

Embodiments of the present principles generally relate to semiconductor processing of semiconductor substrates.

BACKGROUND

Hybrid bonding is the bonding of more than one type of material in a single bonding process. For example, a die may be formed of a dielectric material and have copper contacts. A substrate may also be formed of a dielectric material and have copper contacts. When the die is bonded to the substrate, the dielectric material of the die bonds to the dielectric material of the substrate and the contacts of the die bond to the contacts of the substrate. In order to form a proper bond, both the die and the substrate undergo bonding preparation processes (activation) which involve several different types of process chambers. The substrate holding the dies undergoes a different preparation process than the substrate to which the dies will be bonded. When using a traditional standalone bonder in a simplistic bonding process, the processes of the die and substrate can be easily coordinated, as there is no in tool activation involved, so that each will be ready for insertion into the bonder. However, the inventors have observed, that as multiple sources of dies are needed for bonding to the substrate, coordinating the inline activation processes becomes extremely difficult, if not impossible.

Accordingly, the inventors have provided methods for improving hybrid bonding sequences with the capability to account for complex multiple die sources within reasonable queue time while optimizing the throughput of integrated hybrid bonding tools.

SUMMARY

Methods for sequencing a hybrid bonding process for an integrated hybrid bonding tool are provided herein.

In some embodiments, a method for sequencing a hybrid bonding process may comprise selecting a source of dies for bonding, selecting a target on which the dies will be bonded, linking the source to the target, linking the target to the source, forming an integrated bonding product sequence that includes at least one first linked bonding sequence for the source and a second linked bonding sequence for the target, determining bonding process chamber allocations and process timing for the source and the target based on the integrated bonding product sequence, and bonding the die from the source to the target using the integrated bonding product sequence.

In some embodiments, a method for sequencing a hybrid bonding process may comprise selecting a source of dies for bonding, selecting a target on which the dies will be bonded, linking the source to the target, linking the target to the source, forming an integrated bonding product sequence that includes a first linked bonding sequence for the source and a second linked bonding sequence for the target, determining bonding process chamber allocations and process timing for the source and the target based on the integrated bonding product sequence, comparing the integrated bonding product sequence with a user supplied bonding sequence, determining differences between the integrated bonding product sequence and the user supplied sequence, and notifying the user of the differences and compatibility with a hybrid bonding tool.

In some embodiments, a non-transitory, computer readable medium having instructions stored thereon that, when executed, cause a method for sequencing a hybrid bonding process to be performed, the method may comprise selecting a source of dies for bonding, selecting a target on which the dies will be bonded, linking the source to the target, linking the target to the source, forming an integrated bonding product sequence that includes at least one first linked bonding sequence for the source and a second linked bonding sequence for the target, determining bonding process chamber allocations and process timing for the source and the target based on the integrated bonding product sequence, and bonding the die from the source to the target using the integrated bonding product sequence.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
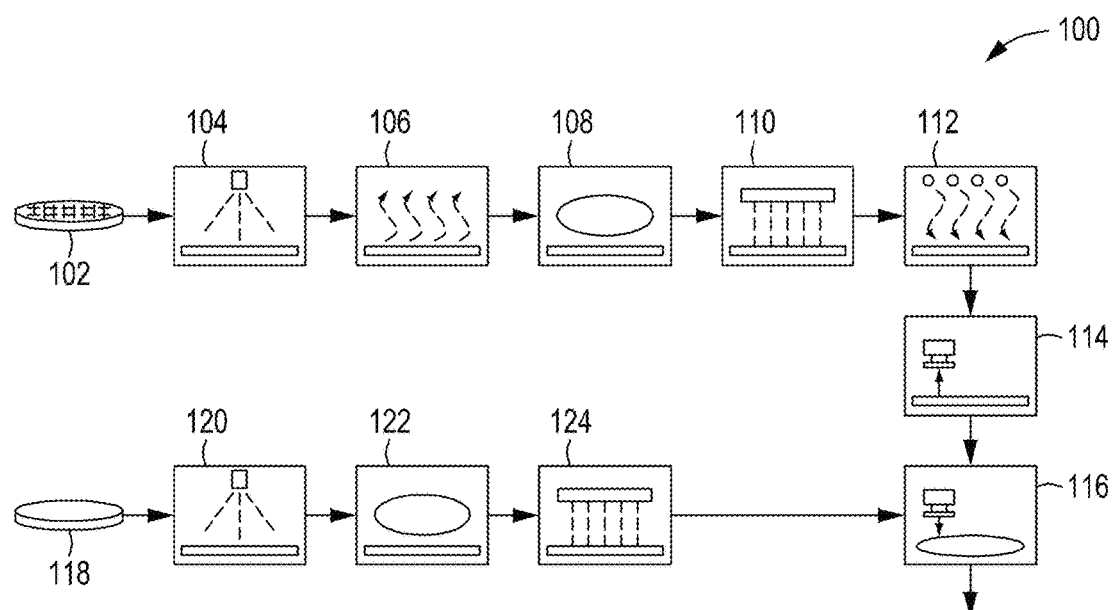
FIG. 1 depicts a process flow for hybrid bonding in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a doubly linked product sequence for hybrid bonding applications which defines the complete scheme of activating and bonding. A product sequence is set of one target and at least one (or more) source sequence(s). Every target sequence contains references/links to all source sequences, whereas every source sequence has references/link to the Target sequence. The doubly linked product sequence includes the bonding order with links from the source (die source) to the target and from the target to the source. The methods allow for hybrid bonding with varying levels of complexity where each of the materials involved may have separate sequences of bonding pre-activation. In addition, the double linking ties the source and target sequences together to prevent user mistakes and to optimize the routing of the materials through an integrated bonding tool to meet dwell or queue time requirements. The methods enable complex die patterns, selection of die bonding order, and substantially reduced dwell time between when a first die is bonded to when a last die is bonded to a target wafer.

A hybrid bonding product, in a simplest form, requires two materials—a target and a source. The target, as used herein, is a substrate or wafer on which dies are to be bonded. A source, as used herein, is a component wafer on which dies are picked from and placed on the target during a bonding process. Depending upon complexity, the number of source wafer types can vary. The final semiconductor product, such as a chip, may have any number of dies from any number of sources. Before bonding can occur, the source and target both need to be prepared for the actual bonding act. The target and source are routed through various process chambers and processes. Once the materials (i.e., target and source) are fully prepared, the materials are moved to a bonding chamber. A bonding sequence of the present principles also defines the order of die bonding and the paired material (source for target and target for source). In the present methods, since the bonding process for a target wafer clearly specifies the source sequence used, and the source sequence specifies the target used, the source sequence and the target sequence lock in together as a single product sequence (integrated bonding product sequence). The single product sequence not only allows the sequence/scheduler to time the moves of the target and the correct source into the bonder to maintain the queue time below an activation threshold, but also allows a reduction in user mistakes over submitting process jobs using individual sequences.

The methods provide an overall performance improvement in hybrid bonding process flows by doubly linking the target and source bonding process flows and forming an integrated bonding product sequence. The methods are optimized for integrated hybrid bonding tools with onboard auxiliary process chambers and buffers. An integrated hybrid bonding tool, such as the integrated hybrid bonding tool depicted in FIG. 7 (discussed below), provides multiple processing chambers or stations in a controlled environment. The controlled environment allows processing in individual chambers and movement of substrates between chambers without a risk of contamination by exposure to undesirable environments that might cause, for example, oxidation of materials on the substrates and/or particulate depositions on the substrates that cause damage and/or hamper performance.

FIG. 1 depicts an example of bonding process flows 100 for a target 118 and a source 102 and is not meant to be limiting. In a bonding process, both dies (source) and targets on which the dies are to be bonded are prepared prior to bonding to enhance the bonding performance. In some cases, the source 102 can be processed in parallel, prior to, or after a target 118 on which a die from the source 102 is to be bonded. As used herein, a source may be a wafer or substrate that provides a film frame, a chiplet, a top die, or a component for bonding to a target such as a substrate, base wafer, base die, or unit, respectively. For the sake of brevity, and not meant to be limiting, the term 'die' will be used herein to refer to a film frame, a chiplet, a top die, or a component supplied by the source which is to be bonded to a target.

The source 102 may undergo other processes prior to the hybrid bonding processes. The other processes may include upstream processing such as patterning, chemical mechanical polishing (CMP), back grinding, dicing, and the like. In some embodiments, for example, dies may be separated (singulated) and held together on the back side by dicing tape to create the source 102. In some embodiments, dies may be reconstituted (molded) on a carrier wafer to form the source 102 from which dies are selected for bonding. In the bonding process flows 100, in some embodiments, the source 102 typically undergoes a first wet clean process 104 and then a degassing process 106 to aid in removing moisture from the source 102. The source 102 is then subjected to a first plasma activation process 108 to increase bonding attraction and then subjected to a first hydration process 110. The source 102 is then subjected to a radiation process 112 (e.g., UV radiation, etc.) to loosen an adhesive bond holding the dies to the source 102 prior to bonding. In some embodiments, the target 118 may undergo other processes prior to the bonding process flows 100. The target 118 may also have prior stacked dies on the target 118. The target 118 is processed prior to, in conjunction with, or after the processing of the source 102. In some embodiments, the target 118 first undergoes a second wet cleaning process 120 and is then subjected to a second plasma activation process 122. The target 118 then undergoes a second hydration process 124 in preparation for bonding.

Figure 2:
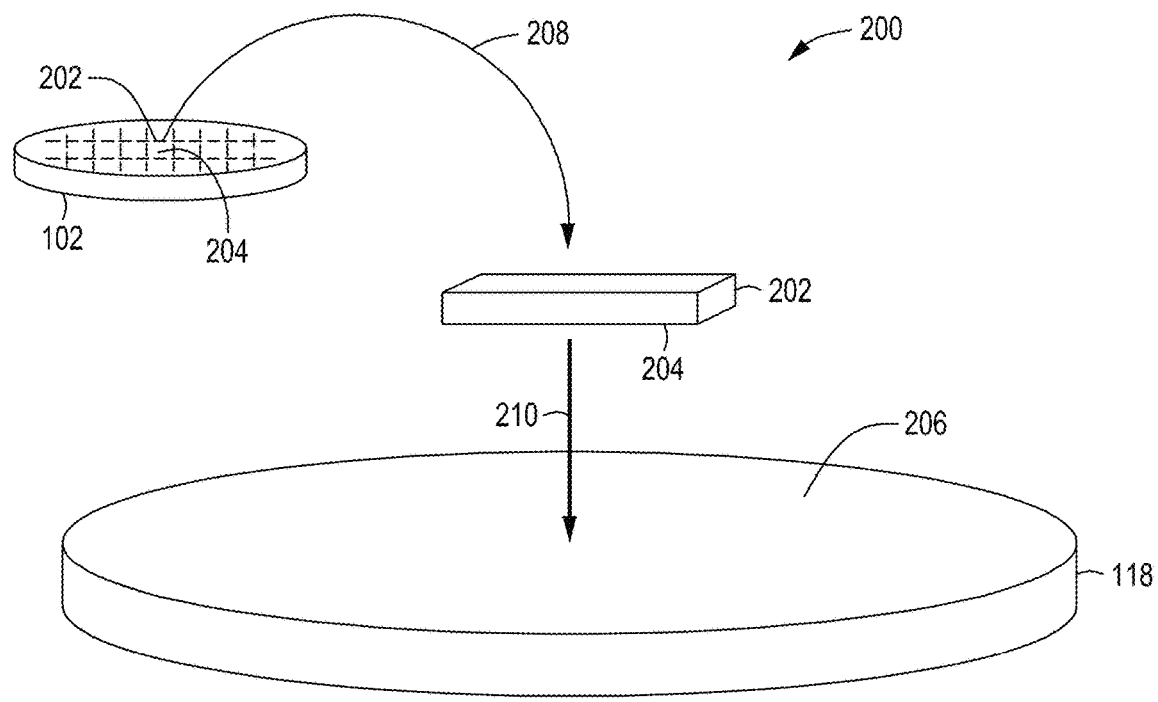
FIG. 2 depicts an isometric view of bonding surfaces for a die and a substrate in accordance with some embodiments of the present principles.

Bonding is then accomplished by subjecting the source 102 to an ejection and picking process 114 that allows a die to be selected and flipped in preparation for bonding. In a bonding process 116, the die is placed on the target 118 and the die bonds to the target 118 yielding a die-to-target bonded target 126. The die-to-target bonded target 126 may have a plurality of dies bonded to the surface during one or more bonding sessions. In some embodiments, a low temperature annealing process is performed on the die-to-target bonded target 126 to reflow connections of the die and target to further bond the connections. FIG. 2 is an isometric view 200 that depicts a die 202 from the source 102 being ejected/flipped and bonded to a target bonding surface 206 of the target 118. When the die 202 is attached to the source 102, an uppermost surface of the die 202 is the die bonding surface 204. When the die 202 is flipped 208, the lowermost surface of the die 202 becomes the die bonding surface 204. During bonding 210, the die bonding surface 204 and the target bonding surface 206 are brought into contact and allowed to bond together. The bonding performance is influenced by parameters such as bonding surface contamination (preparation), bonding pressure, and/or bonding temperature, and the like.

One aspect of forming the integrated bonding product sequence is to account for any processing requirements (e.g., queue time, etc.) and any possible timing issues or bottlenecks between the source sequences and the target sequence (e.g., limited number or only one process chamber available at a given time, etc.). In other words, the process time (e.g., queue time) and the throughput (e.g., bottleneck) need to both be satisfied for the integrated bonding product sequence to function maximally. In traditional processing flows, the sources are considered as consumables (sources supply dies) and not treated as wafers. In the present methods, the sources are first treated as wafers during preparation for the bonding processes and then as consumables during the actual bonding processes. Factors and constraints of bonding processes and equipment are used to align (synchronizing of the materials—target and sources) the source bonding processes and the target bonding process to yield a desirable result.

The methods of the present principles account for the complexities of the bonding processes in the formation of the integrated bonding product sequence (product sequence). Factors, such as but not limited to, target selection, one or more source selections, chamber metrics (e.g., recipes, motion control, etc.), robot speed profiles, die location bonding maps (e.g., E142 maps and the like), and/or die level constitution of materials (e.g., material type, binning, source and source location, etc.) may be accounted for in the integrated bonding product sequence. Additional constraints may also be compensated for in the integrated bonding product sequence such as, but not limited to, maximizing the bonder utilization, minimizing queue time for critical processes (e.g., just-in-time processing of materials, etc.), user-created process sequences associated with a particular task, and/or optimizing both the material handling for in-time consumption while maximizing bonder utilization and the like.

Figure 3:
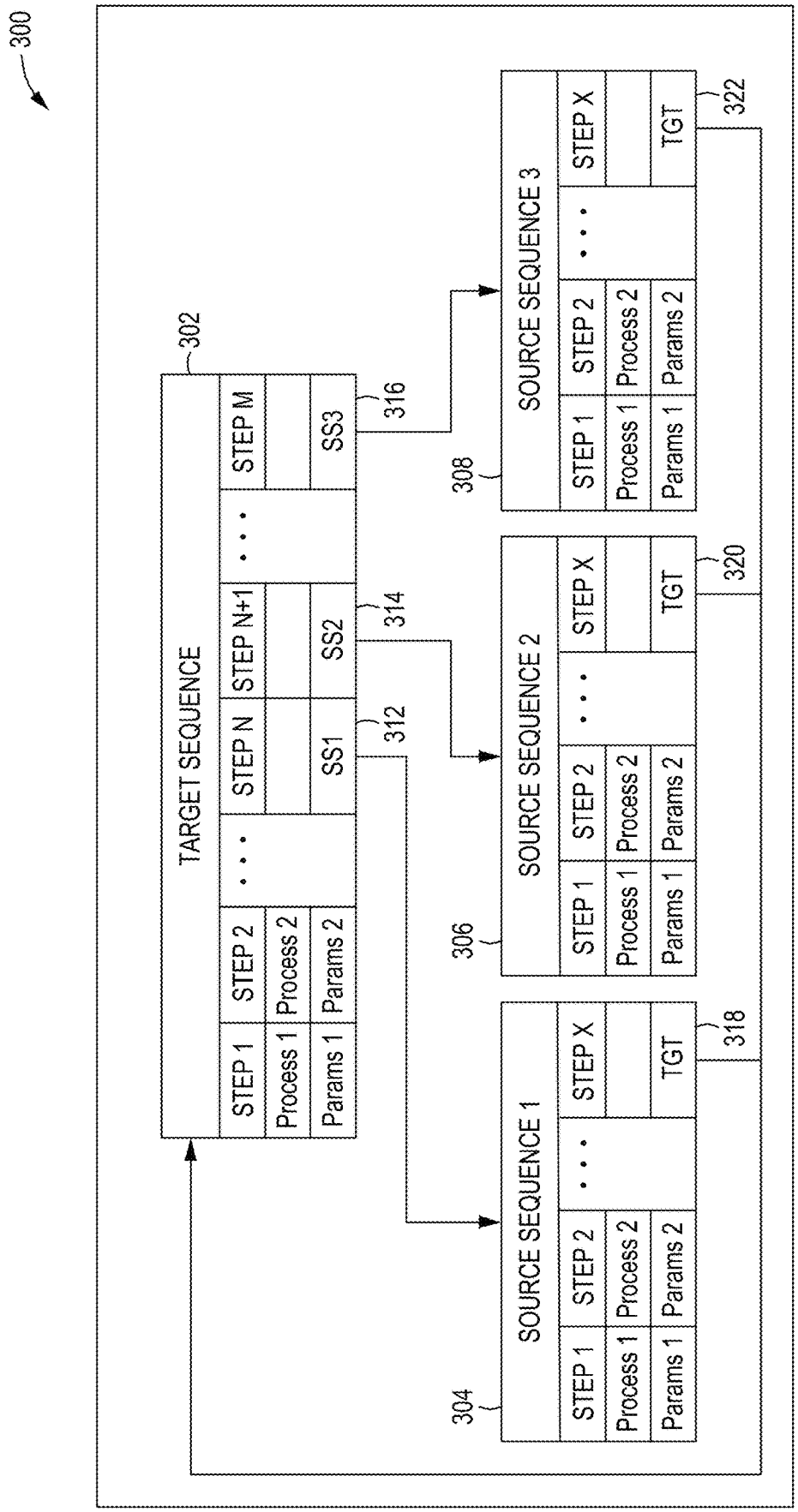
FIG. 3 depicts a schematic view of a user interface for doubly linking multiple sources and a target in accordance with some embodiments of the present principles.

In some embodiments, in order to provide an easy and intuitive linking process to create the integrated bonding product sequence, a user interface (UI) 300 as depicted in FIG. 3 may be used. In the example UI 300, a user can easily link a target sequence 302 to a first source sequence 304 via a first source sequence link entry 312 in the target sequence 302. Likewise, a second source sequence 306 is linked to the target sequence 302 via a second source sequence link entry 314. Similarly, a third source sequence 308 is linked to the target sequence 302 via a third source sequence link entry 316. Any number of sources can be linked to a given target source sequence. In a similar fashion, the first source sequence 304 is linked to the target sequence 302 via a first target sequence link entry 318 in the first source sequence 304. The second source sequence 306 is linked to the target sequence 302 via a second target sequence link entry 320 in the second source sequence 306, and the third source sequence 308 is linked to the target sequence 302 via a third target sequence link entry 322 in the third source sequence 308. The double linking of the target to the sources and the sources to the target enables the formation of the integrated bonding product sequence that includes one or more source bonding processes and at least one target bonding process.

In other words, to perform STEP N of the target sequence 302, source 1 is required and should be ready for bonding during STEP N of the target sequence 302. At the same time, source 1 should be ready for bonding to the target at STEP X of source sequence 1. To perform STEP N+1 of the target sequence 302, source 2 is required and should be ready for bonding during STEP N+1 of the target sequence 302. At the same time, source 2 should be ready for bonding to the target at STEP X of source sequence 2. To perform STEP M of the target sequence 302, source 3 is required and should be ready for bonding during STEP M of the target sequence 302. At the same time, source 3 should be ready for bonding to the target at STEP X of source sequence 3. A user can easily link and see the linked relationships by using such a user interface. The UI 300 is meant as an example and not meant to be limiting.

Figure 4:
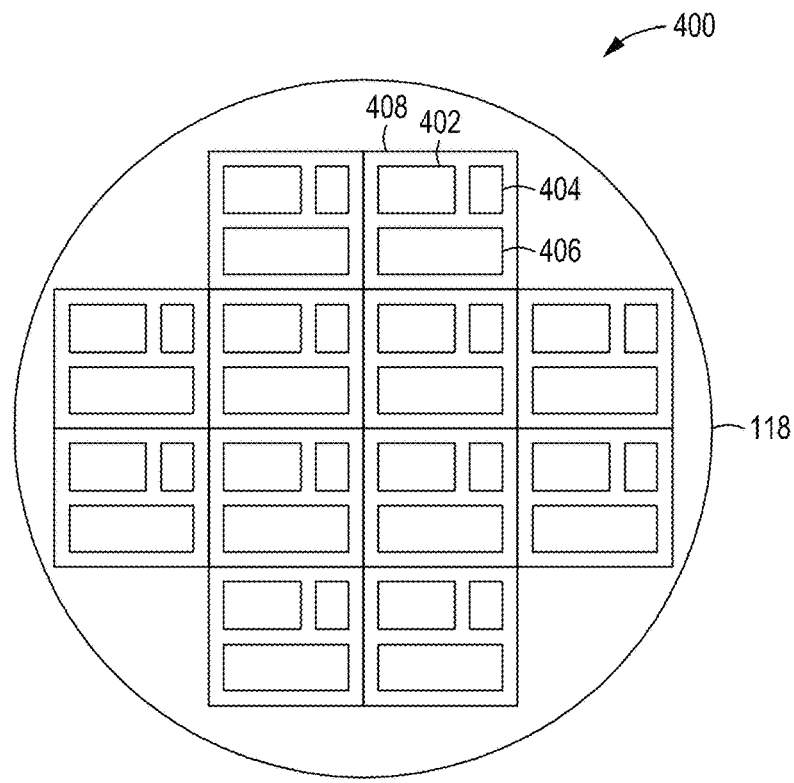
FIG. 4 depicts top-down view of die bonding locations on a target in accordance with some embodiments of the present principles.

As can be seen from FIGS. 1, the bonding process for a single source and target can be complex due to resource scheduling issues, transport times, and overall timing to allow the die and target to arrive at the bonder at the correct moment for bonding. When a target requires multiple sources to provide multiple types of dies, the complexity becomes too overwhelming for a user to properly schedule all of the resources needed. The methods of the present principles provide a solution for the complex problem. For example, a target that incorporates multiple sources may have multiple bonding locations. A view 400 of FIG. 4 depicts an example of the target 118 having a first die bond location 402, a second die bond location 404, and a third die bond location 406 for a single chip 408. Each die bond location may receive a die from a different source. In some cases, the order in which the bond locations are populated may be critical. The methods provided herein can account for the criticalities and ensure that bonding occurs in the correct order.

Another issue accounted for by the present methods is the binning of dies on a source wafer. During manufacturing, defects may cause performance drops on certain dies on the source wafer. Some targets may require only the highest performing dies, reducing the number of useable dies from the source wafer for a particular target. For example, in a view 500 of FIG. 5, an example of the source 102 having multiple bin types of dies such as bin type A 502 and bin type B 504 is depicted. As dies are removed from the source 102, the number of available dies of a given bin type is reduced, leaving empty locations 506 on the source 102. In some instances, multiple sources containing the same die bin type may need to be scheduled at a bonder to meet the requirements of a given target, adding to the complexity of the process. In addition, the integrated hybrid bonding tool 700 has many process chambers and flow control assemblies (e.g., robotic transfer tools, buffers, etc.) that require appropriate scheduling in the integrated bonding product sequence.

In some embodiments, in order to form the integrated bonding product sequence (product sequence), the following parameters are determined to enable a working integrated bonding product sequence. First, the product sequence accounts for resources and timing issues of both the source bonding processes and the target bonding processes. Any resource bottlenecks must be resolved by aligning or synchronizing of the source and target bonding processes. The number of steps in each process as well as the duration of the steps are taken into account. The product sequence aligns the processes to eliminate the resource bottlenecks while further using timing of the processing to control the feed rate of the sources and targets to control the throughput of the bonding. Second, the integrated bonding product sequence must account for the process chamber metrics. For example, and not meant to be limiting, time to receive a particular kind of wafer, time for a robot to pick up and/or put down a wafer, time to run a process recipe (chamber processing time), and/or time for a robot to transfer a wafer through an integrated hybrid bonding tool.

Figure 5:
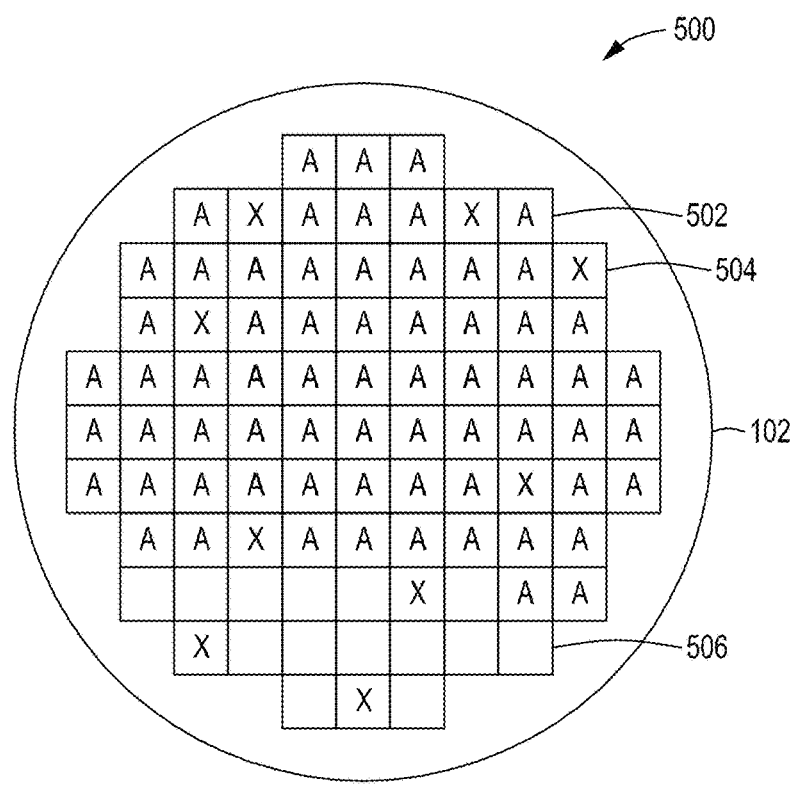
FIG. 5 depicts top-down view of singulated die locations with bin information for a source in accordance with some embodiments of the present principles.

The overall duration may include wafer handling time (e.g., automation or robot time) plus all processing time. In addition, other miscellaneous time may be included such as the amount of time a process chamber takes to be put into a safe condition (e.g., evacuation of harmful gases prior to release of the wafer, etc.). The movement of the wafer through the integrated tool may be referred to as 'motion control.' The robot speed profiles for active robot handling of the wafers may also be used in the determination of the integrated bonding product sequence. Likewise, die bonding maps (e.g., E142 maps, etc.) and die level constitution (e.g., binning, processor speed, etc.) may also be used. As depicted in FIG. 5, source wafers may not have all of the same binning for the dies and not 100% of the dies are then usable for a particular target. In addition, some source wafers may have fewer available dies than other source wafers. Additional sources may need to be loaded into the bonder in order to complete a target bonding process.

In the alternative, the target may be moved to the next bonder and then back to the first bonder when more of a particular die type are available in the process. In some instances, a particular target may need a lesser bin type and may be put a head in the process if the lesser bin type is available. The integrated bonding product sequence takes into account many, if not all, of the above scenarios and more. The integrated bonding product sequence also takes into account user desired constraints. For example, but not meant to be limiting, the user may set an activation or queue time that must be met for the bonding process. The integrated bonding product sequence will attempt to maximize resources and throughput in light of a user's constraints. If maximizing resources and throughput is not possible due to the user's constraints, the integrated bonding product sequence can give the user a selection of choices as to the weighting of throughput over resource maximization or give results based on increasing tolerances of a given user constraint.

Figure 6:
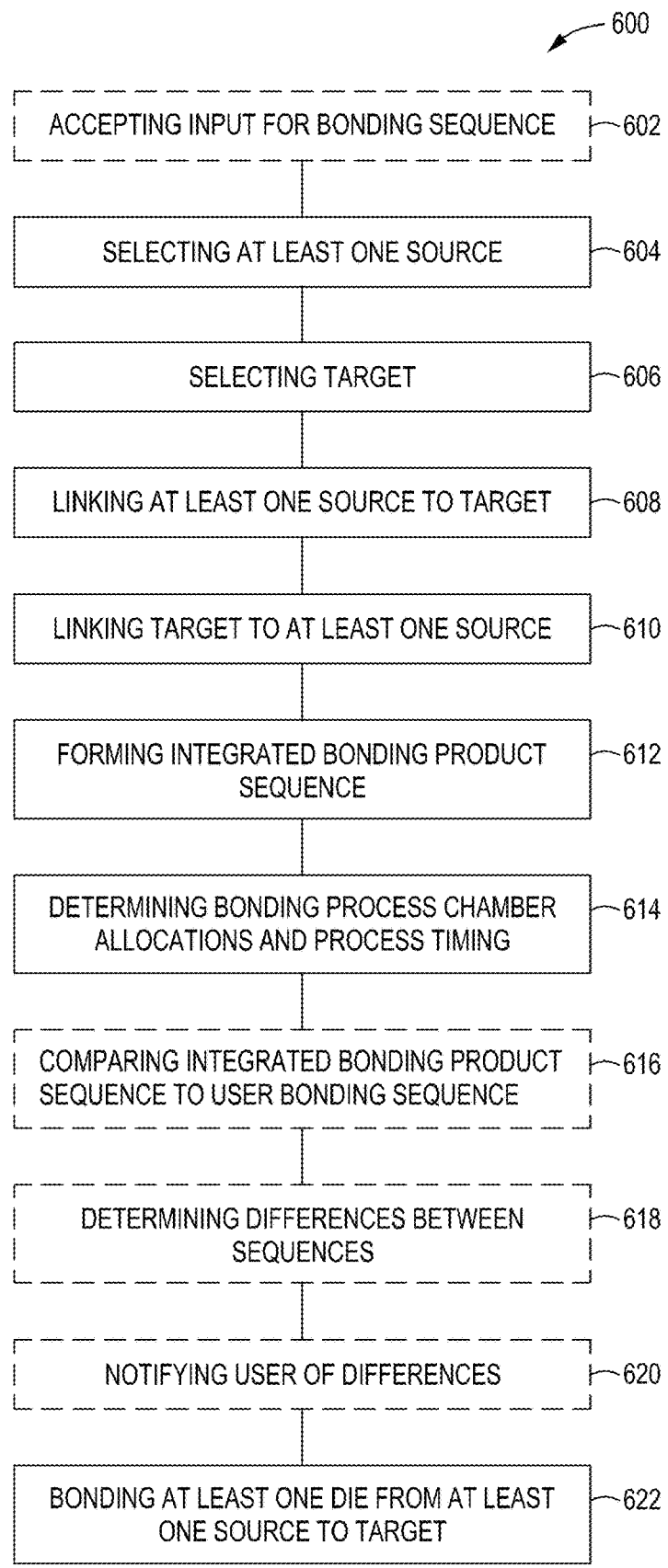
FIG. 6 is a method of sequencing a hybrid bonding process in accordance with some embodiments of the present principles.

A method 600 for sequencing a hybrid bonding process is depicted in FIG. 6 for some embodiments. In optional block 602, inputs relating to the hybrid bonding process may be accepted. Such inputs may include, but are not limited to, at least one process recipe for at least one process chamber, at least one die map input for a target, and/or at least one process sequence input for bonding. The inputs may be used in determining the bonding process chamber allocations and process timing as described below. The one or more inputs may be accepted at any stage of the method 600. In block 604, at least one source of dies is selected for bonding. In some instances, multiple sources may be selected such that multiple different dies may be bonded onto a single or multiple targets. In block 606, a target is selected on which the dies will be bonded. In block 608, the selected at least one source is linked to the target. In block 610, the selected target is linked to the selected at least one source. In block 612, an integrated bonding product sequence that includes at least one first linked bonding sequence for the at least one source and a second linked bonding sequence for the target is formed.

In block 614, bonding chamber allocations and process timing for the at least one source and the target is determined based on the integrated bonding product sequence. In some embodiments, the determining of the bonding chamber allocations and process timing may include, but is not limited to, accounting for activation queue time of the at least one source and activation queue time of the target, accounting for maximum utilization of at least one hybrid bonding process chamber, accounting for just-in-time consumption for maximum utilization of the at least one hybrid bonding process chamber, accounting for process chamber recipes and motion control durations, accounting for robot transfer speeds, accounting for die level constitution of materials of the at least one source, and/or accounting for die maps for locating dies on the target, and the like. In optional block 616, the integrated bonding product sequence is compared to a user bonding sequence. In optional block 618, differences between the integrated bonding product sequence and the user bonding sequence is determined. In optional block 620, the user is notified of the differences between the sequences. The user may be notified of the differences and compatibility with a hybrid bonding tool. For example, a user may be notified of throughput level or bonder utilization level issues compared to the integrated bonding product sequence. The user may then decide to alter the integrated bonding product sequence or to continue using the integrated bonding product sequence. In block 622, at least one die from the at least one source is bonded to the target based on the integrated bonding product sequence. Or in the alternative, based on the altered integrated bonding product sequence if a user has altered the sequence for a particular desired outcome.

Figure 7:
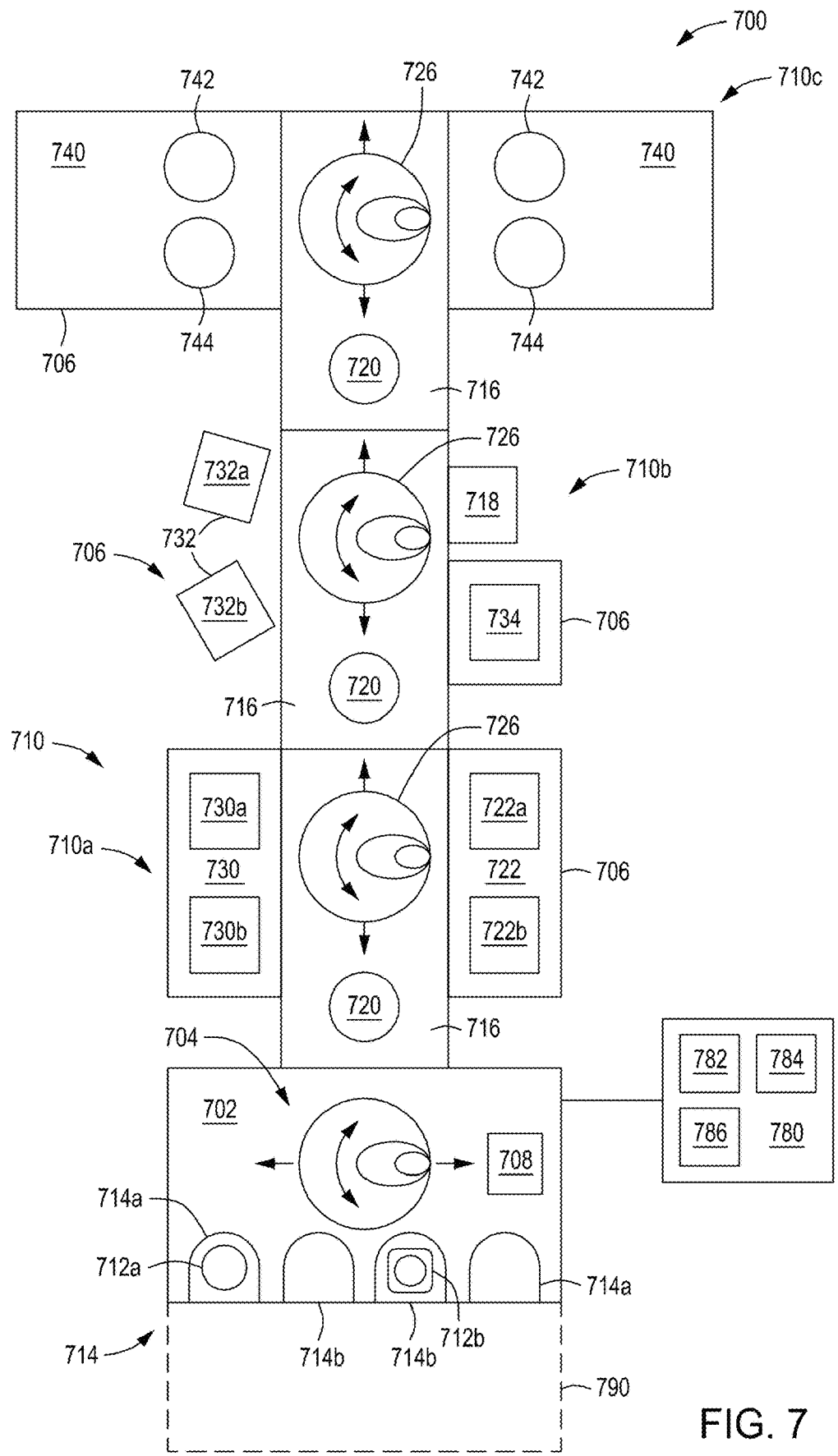
FIG. 7 depicts a schematic top view of an integrated hybrid bonding tool for bonding dies to a substrate in accordance with some embodiments of the present principles.

FIG. 7 depicts a schematic top view of an integrated hybrid bonding tool 700 for bonding dies to a target in accordance with at least some embodiments of the present principles. The methods described above may be performed with the integrated hybrid bonding tool 700. The integrated hybrid bonding tool 700 generally includes an equipment front end module (EFEM) 702 and a plurality of automation modules 710 that are serially coupled to the EFEM 702. The plurality of automation modules 710 are configured to shuttle one or more types of substrates 712 from the EFEM 702 through the integrated hybrid bonding tool 700 and perform one or more processing steps to the one or more types of substrates 712 (e.g., source with dies, a target to bond the dies to, etc.). Each of the plurality of automation modules 710 generally include a transfer chamber 716 and one or more process chambers 706 coupled to the transfer chamber 716 to perform the one or more processes. The plurality of automation modules 710 are coupled to each other via their respective transfer chamber 716 to provide modular expandability and customization of the integrated hybrid bonding tool 700. As depicted in FIG. 7, the plurality of automation modules 710 comprise three automation modules, where a first automation module 710a is coupled to the EFEM 702, a second automation module 710b is coupled to the first automation module 710a, and a third automation module 710c is coupled to the second automation module 710b.

The EFEM 702 includes a plurality of load ports 714 for receiving one or more types of substrates 712. In some embodiments, the one or more types of substrates 712 include 200 mm wafers, 300 mm wafers, 450 mm wafers, tape frame substrates, carrier substrates with or without reconstituted dies, silicon substrates, glass substrates, or the like. In some embodiments, the plurality of load ports 714 include at least one of one or more first load ports 714a for receiving a first type of substrate 712a or one or more second load ports 714b for receiving a second type of substrate 712b. In some embodiments, the first type of substrates 712a have a different size than the second type of substrates 712b. In some embodiments, the second type of substrates 712b include tape frame substrates or carrier substrates. In some embodiments, the second type of substrates 712b include a plurality of dies disposed on a tape frame or carrier plate. In some embodiments, the second type of substrates 712b may hold different types and sizes of dies. As such, the one or more second load ports 714b may have different sizes or receiving surfaces configured to load the second type of substrates 712b having different sizes. In some embodiments, the plurality of load ports 714 are arranged along a common side of the EFEM 702. Although FIG. 7 depicts a pair of the first load ports 714a and a pair of the second load ports 714b, the EFEM 702 may include other combinations of load ports such as one first load port 714a and three second load ports 714b. In addition, the integrated hybrid bonding tool 700 may also incorporate a buffer 790 that provides temporary storage or buffering for sources and targets alike. The buffer 790 aids in allowing the integrated bonding product sequence provided by the present principles to meet timing and other factors and/or constraints by making the targets and/or sources readily available for processing without requiring external retrieval.

In some embodiments, the EFEM 702 includes a scanning station 708 having substrate ID readers for scanning the one or more types of substrates 712 for identifying information. In some embodiments, the substrate ID readers include a bar code reader or an optical character recognition (OCR) reader. The integrated hybrid bonding tool 700 is configured to use any identifying information from the one or more types of substrates 712 that are scanned to determine processing based on the identifying information, for example, different processes and/or placements for the first type of substrates 712a and the second type of substrates 712b. In some embodiments, the scanning station 708 may also be configured for rotational movement to align the first type of substrates 712a or the second type of substrates 712b. In some embodiments, the one or more of the plurality of automation modules 710 include a scanning station 708. An EFEM robot 704 is disposed in the EFEM 702 and configured to transport the first type of substrates 712a and the second type of substrates 712b between the plurality of load ports 714 to the scanning station 708. The EFEM robot 704 may include substrate end effectors for handling the first type of substrates 712a and second end effectors for handling the second type of substrates 712b. The EFEM robot 704 may rotate or rotate and move linearly.

The transfer chamber 716 includes a buffer 720 configured to hold one or more first type of substrates 712a. In some embodiments, the buffer 720 is configured to hold one or more of the first type of substrates 712a and one or more of the second type of substrates 712b. The transfer chamber 716 includes a transfer robot 726 configured to transfer the first type of substrates 712a and the second type of substrates 712b between the buffer 720, the one or more process chambers 706, and a buffer disposed in an adjacent automation module of the plurality of automation modules 710. For example, the transfer robot 726 in the first automation module 710a is configured to transfer the first type of substrates 712a and the second type of substrates 712b between the first automation module 710a and the buffer 720 in the second automation module 710b. In some embodiments, the buffer 720 is disposed within the interior volume of the transfer chamber 716, advantageously reducing the footprint of the overall tool. In addition, the buffer 720 can be open to the interior volume of the transfer chamber 716 for ease of access by the transfer robot 726.

The one or more process chambers 706 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chambers, or the like. Examples of vacuum chambers may include plasma activation chambers. The types of atmospheric chambers discussed above may also be configured to operate under vacuum, if needed. The one or more process chambers 706 may be any process chambers or modules needed to perform a bonding process, a cleaning process, a radiation process, or the like. In some embodiments, the one or more process chambers 706 of each of the plurality of automation modules 710 include at least one of a wet clean chamber 722, a plasma activation chamber 730, a degas chamber 732, a radiation chamber 734, or a bonder chamber 740 such that the integrated hybrid bonding tool 700 includes at least one wet clean chamber 722, at least one plasma activation chamber 730, at least one degas chamber 732, at least one radiation chamber 734, and at least one bonder chamber 740. The one or more process chambers 706 may be arranged in any suitable location of the integrated hybrid bonding tool 700.

The wet clean chamber 722 is configured to perform a wet clean process to clean the one or more types of substrates 712 via a fluid, such as water. The wet clean chamber 722 may include a first wet clean chamber 722a for cleaning the first type of substrates 712a or a second wet clean chamber 722b for cleaning the second type of substrates 712b. The degas chamber 732 is configured to perform a degas process to remove moisture via, for example, a high temperature baking process. In some embodiments, the degas chamber 732 includes a first degas chamber 732a and a second degas chamber 732b. The plasma activation chamber 730 may be configured to perform an activation process on a substrate in preparation for hybrid bonding. The activation aids in increasing bonding strength between surfaces. In some embodiments, the plasma activation chamber 730 includes a first plasma activation chamber 730a and a second plasma activation chamber 730b. The radiation chamber 734 is configured to perform a radiation process to reduce adhesion between dies on a source such as, for example, a tape frame substrate or a carrier substrate with reconstituted dies. For example, the radiation chamber 734 may be an ultraviolet radiation chamber configured to direct ultraviolet radiation at the source or a heating chamber configured to heat the source. The reduced adhesion between the dies and the source facilitates easier removal of the dies from the source. The bonder chamber 740 is configured to transfer and bond at least a portion of the dies from a source to the target. The bonder chamber 740 generally includes a first support 742 to support one of the first type of substrates 712a and a second support 744 to support one of the second type of substrates 712b.

In some embodiments, a last automation module of the plurality of automation module 710, for example the third automation module 710c of FIG. 7, includes one or more bonder chambers 740 (two shown in FIG. 7). In some embodiments, a first of the two bonder chambers is configured to remove and bond dies having a first size and a second of the two bonder chambers is configured to remove and bond dies having a second size. In some embodiments, any of the plurality of automation modules 710 include a metrology chamber 718 configured to take measurements of the one or more types of substrates. In FIG. 7, the metrology chamber 718 is shown as a part of the second automation module 710b coupled to the transfer chamber 716 of the second automation module 710b. However, the metrology chamber 718 may be coupled to any transfer chamber 716 or within the transfer chamber 716.

A controller 780 controls the operation of any of the integrated hybrid bonding tools described herein, including the integrated hybrid bonding tool 700. The controller 780 may use a direct control of the integrated hybrid bonding tool 700, or alternatively, by controlling the computers (or controllers) associated with the integrated hybrid bonding tool 700. In operation, the controller 780 enables data collection and feedback from the integrated hybrid bonding tool 700 to optimize performance of the integrated hybrid bonding tool 700 and to control the processing flow according to methods described herein. The controller 780 generally includes a central processing unit (CPU) 782, a memory 784, and a support circuit 786. The CPU 782 may be any form of a general-purpose computer processor that can be used in an industrial setting. The support circuit 786 is conventionally coupled to the CPU 782 and may comprise a cache, clock circuits, input/output subsystems, power supplies, and the like. Software routines, such as methods as described above may be stored in the memory 784 and, when executed by the CPU 782, transform the CPU 782 into a specific purpose computer (controller 780). The software routines may also be stored and/or executed by a second controller (not shown) that is located remotely from the integrated hybrid bonding tool 700.

The memory 784 is in the form of computer-readable storage media that contains instructions, when executed by the CPU 782, to facilitate the operation of the semiconductor processes and equipment. The instructions in the memory 784 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for sequencing a hybrid bonding process, comprising:
   selecting at least one source of dies for bonding;
   selecting a target on which dies will be bonded;
   linking the at least one source of dies to the target;
   linking the target to the at least one source of dies;
   forming an integrated bonding product sequence that includes at least one first linked bonding sequence for the at least one source of dies and a second linked bonding sequence for the target;
   determining bonding process chamber allocations and process timing for the at least one source of dies and the target based on the integrated bonding product sequence; and
   bonding at least one die from the at least one source of dies to the target using the integrated bonding product sequence.

2. The method of claim 1, wherein determining bonding process chamber allocations and process timing includes accounting for activation queue time of the at least one source of dies and activation queue time of the target.

3. The method of claim 1, wherein determining bonding process chamber allocations and process timing includes accounting for maximum utilization of at least one hybrid bonding process chamber.

4. The method of claim 3, wherein determining bonding process chamber allocations and process timing includes accounting for just-in-time consumption for maximum utilization of the at least one hybrid bonding process chamber.

5. The method of claim 1, wherein determining bonding process chamber allocations and process timing includes accounting for process chamber recipes and motion control durations.

6. The method of claim 1, wherein determining bonding process chamber allocations and process timing includes accounting for robot transfer speeds.

7. The method of claim 1, wherein determining bonding process chamber allocations and process timing includes accounting for die level constitution of materials of the at least one source of dies.

8. The method of claim 1, wherein determining bonding process chamber allocations and process timing includes accounting for die maps for locating dies on the target.

9. The method of claim 1, further comprising:
   comparing the integrated bonding product sequence with a user supplied bonding sequence;
   determining differences between the integrated bonding product sequence and the user supplied bonding sequence; and
   notifying the user of the differences and compatibility with a hybrid bonding tool.

10. The method of claim 9, further comprising:
    notifying a user of throughput level or bonder utilization level compared to the integrated bonding product sequence.

11. The method of claim 1, further comprising:
    accepting at least one recipe input for at least one process chamber;
    accepting at least one die map input for the target;
    accepting at least one process sequence input for bonding; and
    determining bonding process chamber allocations and process timing based on the at least one recipe input, the at least one die map input, or the at least one process sequence input.

12. A method for sequencing a hybrid bonding process, comprising:
    selecting at least one source of dies for bonding;
    selecting a target on which dies will be bonded;
    linking the at least one source of dies to the target;
    linking the target to the at least one source of dies;
    forming an integrated bonding product sequence that includes at least one first linked bonding sequence for the at least one source of dies and a second linked bonding sequence for the target;
    determining bonding process chamber allocations and process timing for the at least one source of dies and the target based on the integrated bonding product sequence;
    comparing the integrated bonding product sequence with a user supplied bonding sequence;

determining differences between the integrated bonding product sequence and the user supplied bonding sequence; and notifying the user of the differences and compatibility with a hybrid bonding tool.

13. The method of claim 12, further comprising:

notifying a user of throughput level or bonder utilization level compared to the integrated bonding product sequence.

14. The method of claim 12, further comprising:

accepting at least one recipe input for at least one process chamber;

accepting at least one die map input for the target;

accepting at least one process sequence input for bonding; and determining bonding process chamber allocations and process timing based on the at least one recipe input, the at least one die map input, or the at least one process sequence input.

15. The method of claim 12, wherein determining bonding process chamber allocations and process timing includes accounting for activation queue time of the at least one source of dies and activation queue time of the target.

16. The method of claim 12, wherein determining bonding process chamber allocations and process timing includes accounting for maximum utilization of at least one hybrid bonding process chamber.

17. The method of claim 12, wherein determining bonding process chamber allocations and process timing includes at least one of a, b, c, or d:
   (a) accounting for process chamber recipes and motion control durations;
   (b) accounting for robot transfer speeds;
   (c) accounting for die level constitution of materials of the at least one source; or
   (d) accounting for die maps for locating dies on the target.

18. A non-transitory, computer readable medium having instructions stored thereon that, when executed, cause a method for sequencing a hybrid bonding process to be performed, the method comprising:

selecting at least one source of dies for bonding;

selecting a target on which dies will be bonded;

linking the at least one source of dies to the target;

linking the target to the at least one source of dies;

forming an integrated bonding product sequence that includes at least one first linked bonding sequence for the at least one source of dies and a second linked bonding sequence for the target;

determining bonding process chamber allocations and process timing for the at least one source of dies and the target based on the integrated bonding product sequence; and bonding at least one die from the at least one source of dies to the target using the integrated bonding product sequence.

19. The non-transitory, computer readable medium of claim 18, wherein determining bonding process chamber allocations and process timing includes at least one of a, b, c, d, e, f, and g:
   (a) accounting for activation queue time of the at least one source of dies and activation queue time of the target;
   (b) accounting for maximum utilization of at least one hybrid bonding process chamber;
   (c) accounting for just-in-time consumption for maximum utilization of the at least one hybrid bonding process chamber;
   (d) accounting for process chamber recipes and motion control durations;
   (e) accounting for robot transfer speeds;
   (f) accounting for die level constitution of materials of the at least one source of dies; or
   (g) accounting for die maps for locating dies on the target.

20. The non-transitory, computer readable medium of claim 18, the method further comprising:

comparing the integrated bonding product sequence with a user supplied bonding sequence;

determining differences between the integrated bonding product sequence and the user supplied bonding sequence; and notifying the user of the differences and compatibility with a hybrid bonding tool.

\* \* \* \* \*